United States Patent [19]

Joerg et al.

[11] Patent Number: 5,155,012
[45] Date of Patent: Oct. 13, 1992

[54] DEVELOPER CONCENTRATE AND DEVELOPER PREPARED THEREFROM FOR EXPOSED NEGATIVE-WORKING REPRODUCTION LAYERS AND A PROCESS FOR PRODUCING PRINTING FORMS

[75] Inventors: Klaus Joerg, Ingelheim; Rudolf Zertani, Mainz, both of Fed. Rep. of Germany

[73] Assignee: Hoechst Aktiengesellschaft, Frankfurt am Main, Fed. Rep. of Germany

[21] Appl. No.: 613,010

[22] Filed: Nov. 15, 1990

[30] Foreign Application Priority Data

Nov. 16, 1989 [DE] Fed. Rep. of Germany ....... 3938107

[51] Int. Cl.$^5$ ................................................ G06F 7/32
[52] U.S. Cl. ................................. 430/331; 252/156; 252/173; 252/174.14; 252/174.21; 252/174.22; 252/174.23; 252/174.24; 252/175; 252/525; 252/544; 430/325
[58] Field of Search ............... 430/331, 325; 252/156, 252/173, 174.14, 174.21, 174.22, 174.23, 174.24, 175, 525, 544

[56] References Cited

U.S. PATENT DOCUMENTS

| | | | |
|---|---|---|---|
| 3,867,147 | 2/1975 | Teuscher | 96/33 |
| 4,469,776 | 9/1984 | Matsumoto et al. | 430/331 |
| 4,588,836 | 5/1986 | Matsumoto et al. | 430/25 |
| 4,716,098 | 12/1987 | Mack et al. | 430/331 |

FOREIGN PATENT DOCUMENTS

| | | |
|---|---|---|
| 0080042 | 6/1983 | European Pat. Off. |
| 0301264 | 2/1989 | European Pat. Off. |

*Primary Examiner*—Charles L. Bowers, Jr.
*Assistant Examiner*—Christopher G. Young
*Attorney, Agent, or Firm*—Foley & Lardner

[57] ABSTRACT

A developer concentrate is described which is used by diluting with tap water to give a ready-to-use developer for negative-working exposed reproduction layers on a base. The developer concentrate is a mixture which includes water, an organic solvent, an alkali agent, an anionic surfactant, an n-alkanoic acid and/or its salts, an emulsifier, a buffering substance and, as a complexing agent, an alkali-metal salt of an oligomeric phosphate and/or of N-(2-hydroxyethyl)ethylenediamino-triacetic acid. The developer concentrate according to the present invention exhibits, in particular, the advantage that it is stable as a concentrate, i.e, exhibits no phase separations, precipitates or turbidities, etc., and can be diluted without difficulties to produce the ready-to-use developer. The latter is also stable and exhibits optimum developer properties.

34 Claims, No Drawings

DEVELOPER CONCENTRATE AND DEVELOPER PREPARED THEREFROM FOR EXPOSED NEGATIVE-WORKING REPRODUCTION LAYERS AND A PROCESS FOR PRODUCING PRINTING FORMS

BACKGROUND OF THE INVENTION

The present invention relates to a developer concentrate capable of dilution with tap water to a ready-to-use state, which concentrate is suitable for developing negative-working exposed reproduction layers in copying materials, and also to a process for producing printing forms.

Copying materials of the above-mentioned type are used, in particular, in producing printing plates or photoresists and are composed of a layer base and a negative-working, photosensitive reproduction layer. The layer bases used in these copying materials comprise metals such as zinc, chromium, copper, brass, steel, aluminum or combinations of these metals, plastic sheets, paper or similar materials. The layer bases may be coated with the photosensitive reproduction layer without a modifying pretreatment; however, the layer bases preferably are coated after carrying out a surface modification such as a mechanical, chemical or electrochemical roughening, an oxidation and/or a treatment with hydrophilizing agents (for example, in offset printing plate bases). The reproduction layer includes water-insoluble diazonium salt polycondensation products.

In addition to photosensitive components, the reproduction layer may also contain plasticizers, pigments, dyestuffs, wetting agents, sensitizers, indicators and other standard auxiliaries. Such reproduction layers are described comprehensively, for example, in U.S. Pat. No. 3,867,147.

Known developers or developer mixtures have, in particular, the following disadvantages:

they often contain fairly high proportions of organic solvents which should, if possible, no longer be present in modern developers for ecological drawbacks such as a low boiling point, fire hazard, unpleasant smell, adverse effect on waste water and exhaust air and expensive precautions for eliminating the solvents after development;

although lauryl sulfate or other alkyl sulfates or alkane sulfonates often used in conventional practice are, per se, effective developer components for the specified photosensitive reproduction layers, they require a comparatively long development time, they foam too extensively in processing machines, in particular in the case of vertical development, and the solubility in water at low temperatures (for example, from about 10° C. and lower) decreases to an extent such that, at autumn or winter temperatures, flaky residues which are often troublesome for the processor may be produced in the stock solutions. Spots of grease and adhesive residues such as may occur in handling offset printing plates under practical conditions are removed by these developer components at best after a long action time and by additional mechanical aids;

although lauryl sulfate or other alkyl sulfates or alkane sulfonates are frequently suitable when used for the specific reproduction layers for which they were developed and with which they are also successfully used in the respective examples, they exhibit more or less considerable difficulties with layers which are different from these specific reproduction layers, i.e., they cannot be employed universally.

they also are unsuitable in general for suppressing the impurities (flakes and filaments) which are encountered in many cases, mainly in mechanical development, and which settle as redeposits on the printing forms, with the result that optimum quality of the final product cannot be achieved, even when the developer is used for a long time.

U.S. Pat. No. 4,716,098 describes a developer mixture which is different from the prior art described above, does not exhibit the disadvantages thereof and is suitable for developing lithographic printing plates. The layers described therein include a diazonium salt polycondensation product and an alkali-soluble binder which contains carboxyl groups. However, this developer mixture is stable only in very dilute form and therefore exists only in dilute aqueous solution. Specifically, developer includes up to 85% water, as a result of which unnecessarily large containers which have adverse effects on transport and application are needed. Based on the examples described in U.S. Pat. No. 4,716,098, an attempt was made to prepare a concentrate by not adding some of the water in the case of the developer mixtures mentioned therein. It emerged, however, that the components of all the examples no longer dissolve homogeneously and phase separations occur or precipitates appear on freezing which are also no longer reversible after thawing.

SUMMARY OF THE INVENTION

It is therefore an object of the present invention to provide a developer concentrate for negative-working exposed reproduction layers which has a high solids content and also exhibits no precipitates, phase separations or turbidities on thawing even after a fortuitous freezing, can, if necessary, be diluted before use in the printing shop with water containing Ca and Mg ions, in particular tap water, to the extent necessary in practice without precipitates appearing in the process, develops rapidly and in doing so has equally ideal development properties (good resolution of the non-image areas and non-attack of the image areas) in order to enable it to be used in automatic processing systems, develops either as a concentrate or in the various degrees of dilution without flake and filament formation and at the same time has a high economy in use, i.e., can be used even over a prolonged period of time in its development capacity without forming contaminants, and can be used either with binder-containing or with binder-free systems.

Additional objects of the present invention are to provide a developer derived from diluting the present concentrate with tap water, a printing form produced with the present developer and a process for making the present printing form.

In accomplishing the foregoing objects there is provided according to the present invention a developer concentrate comprising a mixture of water, at least one organic solvent, at least one alkali agent, at least one anionic surfactant, at least one n-alkanoic acid and/or its salts, at least one emulsifier, at least one buffering substance and at least one complexing agent wherein said complexing agent comprises an alkali-metal salt of a compound selected from the group consisting of an oligomeric phosphate, N-(2-hydroxyethyl)ethylenediaminetriacetic acid and a mixture thereof. Also provided according to the present invention is a developer comprising the above-described developer concentrate diluted with tap water. Furthermore, there is provided a process for producing a printing form which includes the use of the above-described developer. Further objects, features, and advantages of the present invention will become apparent from the detailed description of preferred embodiments that follows.

DETAILED DESCRIPTION OF THE PREFERRED EMBODIMENTS

A distinguishing feature of the present invention is that the developer contains an oligomeric phosphate and/or N- (2 -hydroxyethyl)ethylenediaminetriacetic acid as a complexing agent. It is surprising that choosing the complexing agent according to the present invention produces developer concentrates which exhibit no precipitates or phase separations; not even if the concentrate is frozen and re-thawed several times.

The complexing agents used in the present invention are the salts of low-molecular-weight phosphates, so-called oligophosphates, containing 2 to 10, in particular 2 to 6, preferably 2 to 4, phosphorus units. Particularly preferred are the alkali-metal salts, in particular the sodium salts.

Particularly advantageous are tetrasodium diphosphate, pentasodium triphosphate and hexasodium tetraphosphate.

The alkali-metal salts, in particular the sodium salt, of N-(2-hydroxyethyl)ethylenediaminetriacetic acid may also be used. These may be used alone or in combination with the low-molecular-weight phosphates. Particularly preferred, however, are developers which contain either a low molecular-weight phosphate or the sodium salt of triacetic acid.

The amount of complexing agent present in the developer concentrate is about 0.1 to 9.0% by weight, in particular 0.5 to 6.0% by weight and preferably about 2.0 to 6.0% by weight. If the developer concentrate contains the alkali-metal salt of N-(2-hydroxyethyl)ethylenediaminetriacetic acid, its preferable content is about 2.0 to 5.0% by weight.

The developer concentrate according to the present invention furthermore includes n-alkanoic acids containing 8 to 12 carbon atoms and/or their salts. Particularly good results are obtained with caprylic, pelargonic, capric and lauric acid. The developer concentrate includes these acids in an amount of about 1.0 to 16.0% by weight, in particular 1.5 to 14.0% by weight.

Many anionic surface-active agents are suitable as surfactants in connection with the present invention. In particular, those selected from the group comprising alkali-metal, preferably sodium, octyl sulfates, dodecyl benzenesulfonate, alkylphenol ether sulfates, naphthalenesulfonates, sulfosuccinates, alkyl ether phosphates or alkalimetal, preferably sodium, oleic acid methyl tauride, have proved especially successful. The anionic surface-active agent is present in the developer concentrate in an amount of about 0.2 to 15.0% by weight, in particular in an amount of about 1.0 to 10.0% by weight, preferably in an amount of about 1.0 to 8.0% by weight.

The emulsifiers used in the present invention are typically selected from the group comprising poly-N-vinyl-N-methylacetamide, water-soluble copolymers of N-vinyl-N-methylacetamide, polyvinyl alcohol, dextrin, gum arabic and cellulose ethers, in particular carboxymethylcellulose. The preferred amount of emulsifier in the developer concentrate is about 0.1 to b 10.0% by weight, in particular about 0.2 to 6.0% by weight, preferably about 1.0 to 5.0% by weight.

Numerous known organic solvents may be used, but those which are selected from the group comprising benzyl alcohol, ethylene glycol monophenyl ether, 1-phenylethanol, 2-phenylethanol and propylene glycol monomethyl and phenyl ether, in particular, have proved successful in practice. The proportion of organic solvent in the developer concentrate is expediently about 0.5 to 15.0% by weight, in particular about 1.0 to 10.0% by weight, preferably about 5.0 to 10.0% by weight.

Preferable buffering systems are, in principle, all those which operate preferably in the pH range from about 8 to 12. In particular, however, the generally available buffering substances selected from the group comprising carbonates, phosphates, borates, alkali-metal salts of glycine and amines, in the latter case preferably diethanolamine and triethanolamine, are used. Very common buffering systems are, for example, mixtures of carbonate/hydrogencarbonate, phosphate/hydrogen-phosphate and the like. The content of buffering substance in the developing concentrate is about 0.5 to 20.0% by weight, preferably about 0.7 to 10.0% by weight.

The alkali agents used are typically alkali-metal hydroxides, in particular LiOH, NaOH and KOH. The proportion of this agent in the developer concentrate is about 1.5 to 8.0% by weight, in particular about 1.5 to 6.0% by weight and preferably about 1.0 to 5.0% by weight.

Because only relatively low proportions of organic solvent are present in the developer mixture, the composition of the latter virtually remains unchanged during use and it consequently has a comparatively long service life in the developing apparatuses.

In general, the pH value of the developer concentrates according to the present invention is preferably about 8 to 12.

The developer concentrate according to the present invention does not exhibit any troublesome odor nuisance and no precipitates occur even at temperatures around the freezing point in the described quantitative range of the components.

Use of the present developer also enables effortless removal of adhesive residues (for example, from sticking on the film masters during copying) and grease spots (for example, from punching the printing plates) even with low developer action time. The development rate is higher than with conventional developers and there is no observable reduction in the developer resistance of the image regions. The salts of the alkanoic acids can also be degraded relatively easily as short-chain "soaps". No flake or filament formation which results in an undesirable contamination of the finished product and of the processing system can be observed.

In addition to the advantageous properties mentioned, it is particularly surprising that the concentrate also always remains homogeneous, even after it has been frozen for a prolonged time and then thawed.

A further advantage is that the developer concentrate according to the present invention can be diluted to the necessary extent at the user's premises. In so doing, even water with a high amount of Ca and Mg ions can be used without precipitates being produced. The concentrated form has the additional advantage that the volume to be transported is lower and therefore the transportation costs are less. This is relevant, in particular, in the case of exported products.

The developer concentrate according to the present invention can in principle be used for most of the negative-working reproduction layers which are known in the prior art. To dilute the concentrate to give the ready-to-use developer for a negative-working, exposed reproduction layer on a base, normal tap water, which includes, in particular, Ca and Mg ions, can be used. The dilution ratio of concentrate to tap water ranges from about 1:0.5 to 1:3 and is preferably about 1:1 to 1:2.

The reproduction layers to be developed may either contain known binders or be binder-free. Preferably, however, the developer concentrate is used with binder-containing reproduction layers. The photosensitive components included in such reproduction layers are, in particular, diazonium salt polycondensation products.

Preferable diazonium salt polycondensation products are condensation products of condensable aromatic diazonium salts, for example of diphenylamine-4-diazonium salts, with aldehydes, preferably formaldehyde. Use is made with particular advantage of co-condensation products which include, in addition to the diazonium salt units, other non-photosensitive units which are derived from condensable compounds, in particular aromatic amines, phenols, phenol ethers, aromatic thioethers, aromatic hydrocarbons, aromatic heterocyclics and organic acid amides. These condensation products are described in DE-A 2,024,244. All the diazonium salt polycondensation products which are described in DE-A 2,739,774 are generally suitable.

The diazonium salt units A-N$_2$X are preferably derived from compounds of the formula $(R^8\text{-}R^9\text{-})_pR^{10}\text{-}NX$, where X is the anion of the diazonium compound,
p is an integer from 1 to 3,
R$^8$ is an aromatic radical having at least one position capable of condensation with an active carbonyl compound,
R$^{10}$ is a phenylene group, and
R$^9$ is a single bond or one of the following groups:

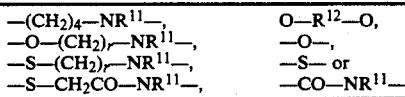

| | |
|---|---|
| —(CH$_2$)$_4$—NR$^{11}$—, | O—R$^{12}$—O, |
| —O—(CH$_2$)$_r$—NR$^{11}$—, | —O—, |
| —S—(CH$_2$)$_r$—NR$^{11}$—, | —S— or |
| —S—CH$_2$CO—NR$^{11}$—, | —CO—NR$^{11}$— | wherein
q is a number from 0 to 5,
r is a number from 2 to 5,
R$^{11}$ is hydrogen, an alkyl group having 1 to 5 carbon atoms, an aralkyl group having 7 to 12 carbon atoms or an aryl group having 6 to 12 carbon atoms, and
R$^{12}$ is an arylene group having 6 to 12 carbon atoms.

The mixtures which can be developed with the developer include, in general, about 5 to 90%, preferably about 10 to 70% by weight of diazonium compound.

To stabilize the photosensitive mixture, it is advantageous to add a compound with an acidic nature to it. Mineral acids and strong organic acids can be used, and of these phosphoric acid, sulfuric acid, perchloric acid, boric acid or p-toluenesulfonic acid are preferred. A particularly well-suited acid is phosphoric acid.

Plasticizers, adhesion promoters, dyestuffs, pigments and color couplers may furthermore be added to the mixtures.

The nature and amount of these additives depend on the field of application envisaged for the photosensitive mixture. In this connection, it is necessary to ensure that the substances added do not absorb an excessive proportion of the actinic light necessary for the crosslinking and thereby reduce the practical photosensitivity.

The photosensitive mixtures may furthermore include dyestuffs and/or pigments which may act both as contrast agents and as layer consolidators. Suitable dyestuffs are, for example, specified in U.S. Pat. Nos. 3,218,167 and 3,884,693. Particularly suitable are, for example, Victoria pure blue FGA, Renol blue B2G-H (C.I. 74160), crystal violet or rhodamine 6 GDN (C.I. 45160). To increase the image contrast after exposure, metanil yellow (C.I. 13065), methyl orange (C.I. 13025) or phenylazodiphenylamine may be used.

Photopolymerizable compounds may also be used as photosensitive compounds. The layers containing these compounds have, as essential constituents, a polymeric binder, a radical-polymerizable compound containing at least one, preferably at least two, terminal ethylenic unsaturated groups and also a polymerization initiator or an initiator combination which can be activated by actinic light.

The developer according to the present invention, prepared from the developer concentrate according to the present invention, can be used for those photopolymerizable layers which do not contain a top layer.

Suitable polymerizable compounds are those which are described in U.S. Pat. Nos. 2,760,863 and 3,060,023.

Preferred examples are acrylic and methacrylic acid esters of dihydric or polyhydric alcohols such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols or N-substituted acrylic and methacrylic acid amides. Reaction products of mono- or diisocyanates with partial esters of polyhydric alcohols are also advantageously used. Such monomers are described in DE-A 2,064,079, 2,361,041 and 2,822,190.

Polymerizable compounds which contain at least one photooxidizable and possibly at least one urethane group in the molecule may also be used.

Suitable photooxidizable groups are, in particular, amino groups, urea groups, thio groups, which may also be constituents of heterocyclic rings, and enol groups. Examples of such groups are triethanolamino, triphenylamino, thiourea, imidazole, oxazole, thiazole, acetylacetonyl, N-phenylglycine and ascorbic acid groups. Polymerizable compounds containing primary, secondary and, in particular, tertiary amino groups are preferred. The compounds described in German Patent Application P 3,825,836.6 and containing photooxidizable groups may be used.

A multiplicity of substances can be used as photoinitiators. Examples are those which are derived from the parent substance of the benzophenones, acetophenones, benzoins, benzils, benzil monoketals, of fluorenone, thioxanthone, of the polynuclear quinones, acridines and quinazolines; and also trichloromethyl-s-triazines, 2-halomethyl-5-vinyl-1,3,4-oxadiazole derivatives, halooxazoles substituted with trichloromethyl groups or carbonylmethylene heterocycles containing trihalomethyl groups, such as are described in DE-A 3,333,450.

Preferred photoinitiators are photoreducible dyestuffs, in particular in combination with the trihalomethyl compounds which can be split by exposure to illumination and possibly with acridine, phenazine or quinoxaline compounds which are active as photoinitiators, such as are described in DE-A 3,710,281 and 3,710,282.

Preferred photoreducible dyestuffs are, in particular xanthene, benzoxanthene, benzothioxanthene, thiazine, pyronine, porphyrin or acridine dyestuffs. The amount of the dyestuff is in general between about 0.01 and 10%, preferably between about 0.05 and 4%, by weight, based on the nonvolatile constituents of the layer.

To increase the photosensitivity, it is possible to add to the layers compounds containing photolytically detachable trihalomethyl groups which are known per se as radical-forming photoinitiators for photopolymerizable mixtures. Compounds containing chlorine and bromine, in particular chlorine, as halogens have proved particularly successful as such coinitiators. The trihalomethyl groups may be bonded directly or via a chain, conjugated throughout, to an aromatic carbocyclic or heterocyclic ring. Preferred are compounds containing a triazine ring in the parent substance which preferably carries two trihalomethyl groups, in particular those described in EP-A 137,452, DE-A 2,718,259 and DE-A 2,243,621. These compounds have intense photo absorptions in the near UV range, roughly around 350-400 nm. Coinitiators are also suitable which themselves do not absorb or only absorb to a slight extent in the spectral range of the copying light, such as trihalomethyltriazines, the substituents with fairly short electron systems capable of mesomerism or aliphatic substituents. Compounds having other basic structures which also absorb in the shorter-wave UV range, for example phenyltrihalomethylsulfones or phenyltrihalomethyl ketones, for example, phenyltribromomethylsulfone, are suitable.

These components are in general added in an amount ranging from 0.01 to 10%, preferably from about 0.05 to 6%, by weight, based on the nonvolatile constituents of the layer.

The layers preferably contain as a further initiator constituent an acridine, phenazine or quinoxaline compound. These compounds are known as photoinitiators and are described in DE-C 2,027,467 and 2,039,861. The sensitivity of the mixture is increased by these compounds, in particular, in the near ultraviolet range. The amount of these components is also in the range from about 0.01 to 10% by weight, preferably between about 0.05 and 5% by weight.

If a further increase in sensitivity in the visible spectral range is desired, this can be achieved by adding a compound of the dibenzal acetone or coumarin type. This addition brings about a higher copy resolution and a continuous sensitization of the mixture for the visible spectral range up to wavelengths of about 600 nm. The amount of this compound is also in the range from about 0.01 to 10%, preferably from about 0.05 to 4%, by weight.

The total amount of polymerization initiators is, in general, about 0.05 to 20%, preferably about 0.1 to 10%, by weight.

Depending on the planned application and on the desired properties, the photopolymerizable layers may contain diverse substances as additives. Examples are: inhibitors to prevent thermal polymerization of the monomers, hydrogen donors, dyestuffs, dyed and undyed pigments, color couplers, indicators, plasticizers and chain transfer agents. These constituents should expediently be so selected that they have as low an absorption as possible in the actinic radiation range which is important for the initiation process.

The developer according to the present invention is also suitable for developing negative-working, photosensitive layers which contain both a diazonium salt polycondensation product and also a photopolymerizable compound.

Preferred binders in the photosensitive layers described are those which contain lateral carboxyl groups. Particularly preferred are binders which are insoluble in water, soluble in organic solvents and soluble or at least swellable in aqueous alkaline solutions. Such binders are described in U.S. Pat. No. 2,861,058, DE-A 3,130,987, 3,404,366 and German Patent Application P 3,825,836.6. Preferable binders containing carboxyl groups are, in particular, copolymers of (meth)acrylic acid and/or their unsaturated homologs such as crotonic acid, copolymers of maleic anhydride or its half-ester, reaction products of polymers containing hydroxyl groups with dicarboxylic acid anhydrides and mixtures thereof.

The above-mentioned polymers are desirable, in particular, if they have a molecular weight between about 500 and 200,000 or above, preferably about 1,000 to 100,000, and an acid value between about 10 and 250, preferably between about 20 and 200.

The following are preferred alkali-soluble binders: copolymers of (meth)acrylic acid with alkyl (meth)acrylates, (meth)acrylonitrile or the like, copolymers of crotonic acid with alkyl (meth)acrylates, (meth)acrylonitrile or the like, copolymers of vinyl-acetic acid with alkyl (meth)acrylates, reaction products of intramolecular anhydrides of organic polycarboxylic acids or of propenylsulfonyl isocyanate with polymers containing hydroxyl groups which do not contain any further functional groups capable of reacting with acid anhydrides or isocyanates, copolymers of maleic anhydride with optionally substituted styrenes, unsaturated hydrocarbons, unsaturated ethers or esters and esterification products (or partial esterification products) of the copolymers of maleic anhydride. The amount of the binder in the photosensitive mixture is in general about 20 to 90% by weight, preferably about 40 to 80% by weight.

The following can be developed with the developer according to the present invention: copying layers for the photomechanical production of printing forms for letter press printing, lithography, gravure printing and screen printing, of embossed copies, for example production of texts in Braille, of individual copies, tannin images, carbon images, etc. The copying layers are of particular importance for the production of lithographic plates and for the photoresist technique.

Suitable layer bases for the developable copying material comprise, for example, aluminum, steel, zinc, copper and plastic sheets made of, for example, polyethylene terephthalate or cellulose acetate, and also screen printing bases such as Perlon gauze. In many cases it is beneficial to subject the base surface to a pretreatment (chemical or mechanical) whose object is to prepare the adhesion of the layer correctly, to improve the lithographic properties of the base surface or to reduce the reflecting power of the base in the actinic region of the copying layer (halation protection).

The photosensitive materials are produced in a known manner. Thus, the layer constituents can be taken up in a solvent and the solution or dispersion applied by casting, spraying, immersion, application with rollers, etc., to the base provided and then dried.

The copying material which can be developed with the developer according to the present invention can be exposed with any light source familiar to the person skilled in the art, for example with tubular lamps, xenon pulse lamps, metal halide doped mercury high pressure lamps and carbon arc lamps. In addition, exposure in standard projection and enlargement apparatuses under the light of metal filament lamps and contact exposure with normal incandescent bulbs are possible. The exposure can also be carried out with coherent light from a laser. Suitable for the purposes of the present invention are lasers of the correct power, for example argon ion, krypton ion, dyestuff, helium/cadmium and helium/neon lasers which emit, in particular, between about 250 and 650 nm. The laser beam can be controlled by means of a specified programmed line and/or raster movement.

The materials are processed further in a known manner. To improve crosslinking of the layer, an afterheating can be carried out after exposure.

The present invention also relates to a process for producing a printing form, which comprises applying a negative-working layer containing, optionally, diazonium salts and/or, optionally, binders to a base, preferably of aluminum or its alloys, which has been pretreated and/or hydrophilized, in particular, mechanically and/or chemically and/or electrochemically, exposing the layer to an image and then developing it with the developer according to the present invention which is prepared by diluting the concentrate according to the invention with water.

Exemplary embodiments of the present invention are specified below. In these, parts by weight (pbw) and parts by volume (pbv) are in the ratio of g to ccm. Percentage and quantitative ratios are to be understood in units of weight, unless otherwise specified.

EXAMPLE 1

An electrochemically roughened, anodically oxidized aluminum foil in sheet form treated with an aqueous solution of polyvinylphosphonic acid is coated with a solution composed of 62 pbw of a polymer prepared by reflux heating using a polyvinyl butyral having a molecular weight of about 70,000 to 80,000 which contains 71% vinyl butyral, 2% vinyl acetate and 27% vinyl alcohol units, maleic anhydride, methyl ethyl ketone and trimethylamine, 21 pbw of a diazonium salt polycondensation product prepared from 1 mol of 3methoxydiphenylamine-4-diazonium sulfate and 1 mol of 4,4'-bis(methoxymethyl)diphenyl ether in 85%-strength phosphoric acid and isolated as mesitylene sulfonate, 2.5 pbw of phosphoric acid (85% strength), pbw of Victoria pure blue FGA (C.I. basic blue 81) and 0.6 pbw of phenylazodiphenylamine in 2570 pbw of ethylene glycol monomethyl ether and 780 pbw of tetrahydrofuran.

The copying layer obtained in this way, which after drying has a layer weight of 0.95 g/m$^2$, is exposed for 30 seconds under a negative using a metal halide lamp with a power of 5 kW and satisfactorily developed with the developer concentrates of Examples 2 to 25 listed below which have previously been diluted with tap water in the specified ratio. None of the concentrates exhibit turbidities, precipitates or phase separations, even after repeated freezing and thawing.

No turbidities or precipitates are observed with the diluted concentrates either. The development times are practical and the non-image areas are developed cleanly. No flake or filament formation can be observed. When the diluted developer concentrates are used in a standard machine to develop and produce a printing form with intermediate rinsing and gumming, no corresponding interferences can be observed either. Several thousand satisfactory impressions can be made from the developed plate in an offset printing machine.

EXAMPLES 2 TO 25

Tables I and II below summarize the respective developer concentrates. The concentrate is prepared by adding the liquid and solid constituents in accordance with their specified content to an amount of deionized water which results from the difference between 100% by weight and the sum of all the liquid and solid constituents. In this process, the liquids are added first, then the solids, while stirring.

After everything has been dissolved, the concentrate is filtered. For the purpose of development, the concentrates obtained are diluted in the specified ratio with water, in particular tap water. The reproduction layers mentioned in Example 1 and also the layers A to E can be developed satisfactorily with these developer mixtures.

TABLE I

| | Composition of the developer concentrate in percent by weight | | | | | | | | | | | |
|---|---|---|---|---|---|---|---|---|---|---|---|---|
| | Example | | | | | | | | | | | |
| | 2 | 3 | 4 | 5 | 6 | 7 | 8 | 9 | 10 | 11 | 12 | 13 |
| Pelargonic acid | 8 | 8 | 8 | 7 | 7 | 8.1 | 8.1 | 8.1 | 12.8 | 7.3 | 7.3 | 8 |
| Octyl sulfate | — | — | — | 6 | 6 | — | — | — | 6.4 | — | — | — |
| Propylene glycol Monophenyl ether | — | — | — | — | — | 8 | 8 | 8 | — | — | — | — |
| $K_2B_4O_7.4H_2O$ | — | — | 2 | 2 | 2 | 2 | 2 | 2 | 3.2 | 2.5 | 2.5 | 2 |
| Solid KOH | 2.8 | 2.8 | 2.8 | 2.5 | 2.5 | 2.8 | 2.8 | 2.8 | 4.5 | 2.6 | 2.6 | 2.8 |
| K salt of glycine | 3.2 | 3.2 | — | — | — | — | — | — | — | — | — | — |
| Poly-N-vinyl-N-methylacetamide | 4 | 4 | 4 | 1 | 1 | 1 | 1 | 1 | — | 2.1 | 2.1 | 1 |
| Na dodecylbenzene sulfonate | 2.6 | 2.6 | 2.6 | — | — | 2.6 | 2.6 | 2.6 | — | 1.4 | 1.4 | 2 |
| Ethylene glycol | 6 | 6 | 6 | 6 | 6 | — | — | — | 9.6 | 6.3 | 6.3 | 8 |

TABLE I-continued

Composition of the developer concentrate in percent by weight

| | Example | | | | | | | | | | | |
|---|---|---|---|---|---|---|---|---|---|---|---|---|
| | 2 | 3 | 4 | 5 | 6 | 7 | 8 | 9 | 10 | 11 | 12 | 13 |
| monophenyl ether | | | | | | | | | | | | |
| Pentasodium triphosphate | — | 6 | 5 | — | 4.1 | 3.3 | — | — | 4.8 | 3.8 | — | 4 |
| Na N-(2-hydroxy-methyl)ethylene-diaminetriacetate | 3 | — | — | 4 | — | — | 3 | — | — | — | 4 | — |
| Hexasodium tetraphosphate | — | — | — | — | — | — | — | 3.3 | — | — | — | — |
| Developer concentrate: deionized water | remainder to 100% | | | | | | | | | | | |
| Developer: dilution ratio water/concentrate | | | | 1:1 | | | | | 2:1 | | 1:1 | |

TABLE II

Composition of the developer concentrate in percent by weight

| | Example | | | | | | | | | | | |
|---|---|---|---|---|---|---|---|---|---|---|---|---|
| | 14 | 15 | 16 | 17 | 18 | 19 | 20 | 21 | 22 | 23 | 24 | 25 |
| Ethylene glycol monophenyl ether | 7.9 | 7.9 | 7.9 | 6.5 | 6.5 | 6.5 | 6.5 | 8.0 | 6 | 6 | 6 | 6 |
| Octyl sulfate | 7.9 | 7.9 | 7.9 | — | — | — | — | — | 4 | 4 | 4 | 4 |
| Solid KOH | 2.4 | 2.4 | 2.4 | 3 | 3 | 3 | 3 | 2.8 | 2 | 2 | 2 | 2 |
| Pelargonic acid | 6.9 | 6.9 | 6.9 | 8.6 | 8.6 | 8.6 | 8.6 | 8.1 | 8 | 8 | 8 | 8 |
| Triethanolamine | 2 | 2 | 2 | 6.5 | 6.5 | 6.5 | 6.5 | — | — | — | — | — |
| Poly-N-vinyl-N-methylacetamide | — | — | — | 4.3 | 2 | 4.3 | 4.3 | 1 | 4 | 4 | 4 | 1.3 |
| $K_2B_4O_7 \cdot 4H_2O$ | — | — | — | — | — | — | — | 2 | — | — | — | — |
| Na dodecylbenzene sulfonate | — | — | — | — | — | — | — | 2.6 | — | — | — | — |
| $K_2CO_3$ | — | — | — | — | — | — | — | — | 3 | 3 | 3 | 3 |
| $KHCO_3$ | — | — | — | — | — | — | — | — | 3 | 3 | 3 | 3 |
| Na N-(2-hydroxy-methyl)ethylene-diamine triacetate | — | — | 3 | — | 3 | — | 3 | — | — | — | — | 3 |
| Tetrasodium diphosphate | — | — | — | — | — | — | — | 3 | — | 2 | — | — |
| Pentasodium triphosphate | 3.3 | — | — | — | — | 4.3 | — | — | — | — | 4 | — |
| Hexasodium tetraphosphate | — | 4 | — | 4 | — | — | — | — | 4 | — | — | — |
| Developer concentrate: deionized water | remainder to 100% | | | | | | | | | | | |
| Developer: dilution ratio water/concentrate | 1:1 | | | | | | | | | | | |

COMPARISON EXAMPLES

Based on DE-A 3,439,597, an attempt is made to concentrate the mixtures in the case of some of the examples specified therein by leaving out water. The amount of water is so chosen that the examples specified in the tables of DE-A 3,439,597 are made up with water not to 100%, but to 50%.

COMPARISON EXAMPLE 1

(Concentration of Example 7 of DE-A 3,439,597)

4.0 pbw (=parts by weight) of pelargonic acid, 3 pbw of ethylene glycol monophenyl ether, 1 pbw of potassium hydroxide, 2 pbw of Na dodecylbenzenesulfonate, 1.5 pbw of potassium carbonate, 1.5 pbw of potassium hydrogen carbonate, 2 pbw of poly-N-vinyl-N-methylacetamide and 2 pbw of nitrilotriacetic acid are added to 33.0 pbw of deionized water while stirring. The developer concentrate remains turbid even after prolonged stirring and is therefore unusable for developing the specified printing layers.

COMPARISON EXAMPLE 2

(Concentration of Example 16 of DE-A 3,439,597)

4.0 pbw (=parts by weight) of pelargonic acid, 3.0 pbw of ethylene glycol monophenyl ether, 1.4 pbw of potassium hydroxide, 2 pbw of Na dodecylbenzenesulfonate, 2 pbw of Graham's salt, 2 pbw of poly-N-vinyl-N-methylacetamide and 1.25 pbw of trisodium phosphate are added to 34.4 pbw of deionized water while stirring. The developer concentrate is at first clear. After freezing (−15° C.) and rethawing, however, two phases are formed. Such a nonhomogeneous concentrate is no longer usable for developing printing layers.

Although the developer mixtures specified in DE-A 3,439,597 are suitable for developing negative binder-containing layers, they cannot be concentrated, as the comparison examples show.

To exemplify the breadth of application of the developer concentrates according to the present invention, further reproduction layers (A to E) which are prepared from the following solutions are developed successfully with the concentrates developed in Examples 2 to 25:

A)
- 1.5 pbw of diazonium salt polycondensation product of 3-methoxydiphenylamine-4-diazonium sulfate and formaldehyde,
- 1.5 pbw of a binder composed of a reaction product of polyvinylbutyral and maleic anhydride,
- 0.1 pbw of Victoria pure blue FGA (C.I. Basic Blue 81),
- 0.1 pbw of 85%-strength phosphoric acid, and
- 96.8 pbw of ethylene glycol monomethyl ether.

The layer weight after drying is 0.8 g/m$^2$

B)
- 1.5 pbw of styrene/maleic anhydride copolymer half-ester (Scripset 540 supplied by Monsanto),
- 1.5 pbw of the diazonium salt polycondensation product from Example 1,
- 0.1 pbw of 85%-strength phosphoric acid,
- 0.1 pbw of Victoria pure blue FGA (C.I. Basic Blue 81), and
- 96.8 pbw of ethylene glycol monomethyl ether.

The layer weight after drying is 0.6 g/m$^2$.

C)
- 97.0 pbw of a polymer prepared by reaction from 11.3 pbw of the polyvinyl butyral mentioned in Example 1 in tetrahydrofuran with 5.11 pbw of propenylsulfonyl isocyanate in tetrahydrofuran,
- 48.3 pbw of the diazonium salt polycondensation product mentioned in EXAMPLE 1,
- 4.8 pbw of 85%-strength phosphoric acid,
- 3.5 pbw of Victoria pure blue FGA (C.I. Basic Blue 81),
- 1.6 pbw of phenylazodiphenylamine in
- 3,500 pbw of ethylene glycol monomethyl ether and
- 1,036 pbw of tetrahydrofuran.

The layer weight after drying is 0.73 g/m$^2$.

D)
- 0.45 pbw of a copolymer of 82% methyl methacrylate and 18% methacrylic acid (acid value 117),
- 1.05 pbw of a polymer prepared by reflux heating using a polyvinyl butyral with a molecular weight of about 70,000 to 80,000 which contains 71% vinyl butyral, 2% vinyl acetate and 27% vinyl alcohol units, maleic anhydride, methyl ethyl ketone and trimethylamine,
- 0.45 pbw of the diazonium salt polycondensation product as in Example 1,
- 0.04 pbw of 85%-strength phosphoric acid,
- 0.09 pbw of Victoria pure blue FGA (C.I. Basic Blue 81),
- 1.5 pbw of pentaerythritol tetraacrylate/triacrylate (technical mixture),
- 0.007 pbw of phenylazodiphenylamine, 0.12 pbw of 2-(4-styrylphenyl)-4,6-bistrichloro methyl-s-triazine in
- 47.7 pbw of ethylene glycol monomethyl ether, and
- 48.6 pbw of butanone.

The layer weight after drying is 1.8 g/m$^2$.

E)
- 2.0 pbw of a styrene/maleic anhydride copolymer partially esterified with alkanol having a mean molecular weight of 20,000 and an acid value around 200,
- 2.0 pbw of a diurethane prepared by reacting glycerol dimethacrylate with hexamethylene diisocyanate,
- 0.125 pbw of 9-phenylacridine,
- 0.05 pbw of a blue dyestuff obtained by coupling 2,4-dinitro-6-chlorobenzenediaazonium salt with 2-methoxy-5-acetamino-N-cyanoethyl-N-hydroxyethylaniline in
- 25.0 pbw of butanone and
- 12.0 pbw of butyl acetate.

The layer weight after drying is 3.7 g/m$^2$.

What is claimed is:

1. A developer concentrate comprising, in admixture: water, from 0.5 to 15% by weight of at least one organic solvent, from 1.5 to 8% by weight of at least one alkali agent, from 0.2 to 15% by weight of at least one anionic surfactant, from 1 to 16% by weight of at least one component selected from the group consisting of n-alkanoic acid, a salt of n-alkanoic acid and a mixture thereof, from 0.1 to 10% by weight of at least one emulsifier, from 0.5 to 20% by weight of at least one buffering substance and from 0.1 to 9% by weight of at least one complexing agent, wherein said complexing agent comprises an alkali-metal salt of a compound selected from the group consisting of an oligomeric phosphate, N-(2-hydroxyethyl)ethylenediaminetriacetic acid and a mixture thereof.

2. A developer concentrate according to claim 1, wherein the amount of said complexing agent present in said concentrate is about 0.5 to 6.0% by weight.

3. A developer concentrate according to claim 2, wherein the amount of said complexing agent present in said concentrate is about 2.0 to 6.0% by weight.

4. A developer concentrate according to claim 1, wherein said complexing agent comprises an alkali-metal salt of N-(2-hydroxyethyl)ethylenediaminetriacetic acid and is present in said concentrate in an amount of about 2.0 to 5.0% by weight.

5. A developer concentrate according to claim 1, wherein said complexing agent comprises an alkali-metal salt of an oligophosphate having 2 to 10 phosphorus units.

6. A developer concentrate according to claim 5, wherein said complexing agent comprises an alkali-metal salt of an oligophosphate having 2 to 6 phosphorus units.

7. A developer concentrate according to claim 6, wherein said complexing agent comprises an alkali-metal salt of an oligophosphate having 2 to 4 phosphorus units.

8. A developer concentrate according to claim 5, wherein said complexing agent is selected from the group consisting of tetrasodium diphosphate, pentasodium triphosphate and hexasodium tetraphosphate.

9. A developer concentrate according to claim 1, wherein said complexing agent comprises a sodium salt of N-(2-hydroxyethyl)ethylenediaminotriacetic acid.

10. A developer concentrate according to claim 1, wherein said n-alkanoic acid and its salt have 8 to 12 carbon atoms.

11. A developer concentrate according to claim 1, wherein the amount of said n-alkanoic acid, said n- alkanoic salt or the mixture thereof present in said concentrate is about 1.5 to 14.0% by weight.

12. A developer concentrate according to claim 1, wherein said n-alkanoic acid and its salt is selected from the group consisting of caprylic, pelargonic, capric and lauric acid.

13. A developer concentrate according to claim 7, wherein the amount of said anionic surface-active agent present in said concentrate is about 1.0 to 8.0% by weight.

14. A developer concentrate according to claim 1, wherein said anionic surface-active agent comprises an alkali-metal salt of a compound selected from the group consisting of octyl sulfate, dodecylbenzenesulfonate, alkyl phenol ether sulfate, naphthalenesulfonate, sulfosuccinate, alkyl ether phosphate and oleic acid methyl tauride.

15. A developer concentrate according to claim 14, wherein said anionic surface-active agent comprises a sodium salt of a compound selected from the group consisting of octyl sulfate, dodecyl benzenesulfonate, alkyl phenol ether sulfate, naphthalenesulfonate, sulfosuccinate, alkyl ether phosphate and oleic acid methyl tauride.

16. A developer concentrate according to claim 1, wherein the amount of said emulsifier present in said concentrate is about 0.2 to 6.0% by weight.

17. A developer concentrate according to claim 1, wherein said emulsifier is selected from the group consisting of a poly-N-vinyl-N-methylacetamide and a water soluble copolymer of N-vinyl-N-methylacetamide, polyvinyl alcohol, dextrin, gum arabic and cellulose ether.

18. A developer concentrate according to claim 17, wherein said cellulose ether comprises carboxymethyl cellulose.

19. A developer concentrate according to claim 1, wherein the amount of said organic solvent present in said concentrate is about 1.0 to 10.0% by weight.

20. A developer concentrate according to claim 1, wherein said organic solvent is selected from the group consisting of benzyl alcohol, phenoxyethanol, 1-phenylethanol, 2-phenylethanol, propylene glycol monomethyl and phenyl ether.

21. A developer concentrate according to claim 1, wherein the amount of said buffering substance present in said concentrate is about 0.7 to 10.0% by weight.

22. A developer concentrate according to claim 1, wherein said buffering substance is selected from the group consisting of a carbonate, phosphate, borate, alkali-metal salt of glycine and an amine.

23. A developer concentrate according to claim 22, wherein said amine comprises diethanolamine or triethanolamine.

24. A developer concentrate according to claim 1, wherein said alkali agent comprises an alkali-metal hydroxide.

25. A developer for developing a negative-working exposed reproduction layer on a base, comprising a developer concentrate according to claim 1 diluted with tap water.

26. A developer according to claim 25, wherein the dilution ratio of concentrate to tap water is about 1:0.5 to 1:3.

27. A developer according to claim 26, wherein the dilution ratio of concentrate to tap water is about 1:1 to 1:2.

28. A developer concentrate according to claim 1, wherein said complexing agent is an alkali metal salt of an oligomeric phosphate.

29. A developer concentrate according to claim 1, wherein said complexing agent is a mixture of an alkali metal salt of an oligomeric phosphate and an alkali metal salt of N-(2-hydroxyethyl)ethylenediaminetriacetic acid.

30. A developer concentrate according to claim 1, wherein said complexing agent is an alkali metal salt of N-(2-hydroxyethyl)ethylenediaminetriacetic acid.

31. A developer concentrate according to claim 1, consisting essentially of water, from 0.5 to 15% by weight of at least one organic solvent, from 1.5 to 8% by weight at lest one anionic surfact, from 1 to 16% by weight of at least one alkali agent, from 0.2 to 15% by weight of at least one component selected from the group consisting of n-alkanoic acid, a salt of n-alkanoic acid and a mixture thereof, from 0.1 to 10% by weight of at least one emulsifier, from 0.5 to 20% by weight of at least one buffering substance and from 0.1 to 9% by weight of at least one complexing agent, wherein said complexing agent comprises an alkali-metal salt of a compound selected from the group consisting of an oligomeric phosphate, N-(2-hydroxyethyl)ethylenediaminetriacetic acid and a mixture thereof.

32. A process for producing a printing form which comprises applying a negative-working reproduction layer which includes a diazonium salt polycondensation resin to a base, exposing said layer to an image and then developing the exposed layer with a developer according to claim 25.

33. A process for producing a printing form, which comprises applying a negative-working reproduction layer which includes a photopolymerizable compound to a base, exposing said layer to an image and then developing the exposed layer with a developer according to claim 25.

34. A process for producing a printing form, which comprises applying a negative-working reproduction layer which includes a diazonium salt polycondensation resin and a photopolymerizable compound to a base, exposing said layer to an image and then developing the exposed layer with a developer according to claim 25.

* * * * *